United States Patent
Pan et al.

(10) Patent No.: US 7,091,118 B1
(45) Date of Patent: Aug. 15, 2006

(54) REPLACEMENT METAL GATE TRANSISTOR WITH METAL-RICH SILICON LAYER AND METHOD FOR MAKING THE SAME

(75) Inventors: James Pan, Fishkill, NY (US); John Pellerin, Hopewell Junction, NY (US); Linda R. Black, Wappingers Falls, NY (US); Michael Chudzik, Beacon, NY (US); Rajarao Jammy, Hopewell Junction, NY (US)

(73) Assignees: Advanced Micro Devices, Inc., Sunnyvale, CA (US); International Business Machines, Armonk, NY (US)

( * ) Notice: Subject to any disclaimer, the term of this patent is extended or adjusted under 35 U.S.C. 154(b) by 0 days.

(21) Appl. No.: 10/988,532

(22) Filed: Nov. 16, 2004

(51) Int. Cl.
*H01L 21/3205* (2006.01)
*H01L 21/338* (2006.01)

(52) U.S. Cl. ............... 438/592; 438/182; 438/183; 257/E29.158; 257/E21.441

(58) Field of Classification Search ............ 438/592, 438/656, 652, 633, 664, 655, 595, 692, 754–755, 438/682, 182, 183; 257/E29.158, E21.441
See application file for complete search history.

(56) References Cited

U.S. PATENT DOCUMENTS

| | | | | |
|---|---|---|---|---|
| 4,563,805 A | * | 1/1986 | Scovell et al. | 438/592 |
| 4,670,970 A | * | 6/1987 | Bajor | 438/467 |
| 5,756,394 A | * | 5/1998 | Manning | 438/618 |
| 5,830,775 A | * | 11/1998 | Maa et al. | 438/141 |
| 6,096,642 A | * | 8/2000 | Wu | 438/655 |
| 6,261,935 B1 | * | 7/2001 | See et al. | 438/592 |
| 6,297,107 B1 | * | 10/2001 | Paton et al. | 438/291 |
| 6,537,613 B1 | * | 3/2003 | Senzaki et al. | 427/250 |
| 6,579,784 B1 | * | 6/2003 | Huang | 438/595 |
| 6,607,958 B1 | * | 8/2003 | Suguro | 438/287 |

* cited by examiner

*Primary Examiner*—Michael Lebentritt
*Assistant Examiner*—Ron Pompey

(57) ABSTRACT

A semiconductor device with a replacement metal gate and the process for making the same removes a dummy gate from a semiconductor device. Within the recess left by the dummy gate is a silicon layer on a gate dielectric layer. A replacement metal is deposited on the thin silicon layer and then reacted with the silicon layer to form a metal-rich silicon layer on the gate dielectric layer.

19 Claims, 3 Drawing Sheets

REPLACEMENT METAL GATE TRANSISTOR WITH METAL-RICH SILICON LAYER AND METHOD FOR MAKING THE SAME

FIELD OF THE INVENTION

The present invention relates to the field of semiconductor processing, and more particularly, to the formation of metallic gate electrodes using the replacement gate process technique.

BACKGROUND OF THE INVENTION

In the integrated circuit (IC) industry, metal-oxide-semiconductor (MOS) transistors have typically been formed utilizing polysilicon gate electrodes. Polysilicon material has been preferred for use as a MOS gate electrode due to its thermal resistive properties (i.e., polysilicon can better withstand subsequent high temperature processing). Polysilicon's robustness during high temperature processing allows polysilicon to be annealed at high temperatures along with source and drain regions. Furthermore, polysilicon's ability to block the ion implantation of doped atoms into a channel region is advantageous. Due to its ion implantation blocking potential, the polysilicon allows for the easy formation of self-aligned source and drain structures after gate patterning is completed. However, polysilicon gate electrodes have certain disadvantages. For example, polysilicon gate electrodes are formed from semiconductor materials that suffer from higher resistivities than most metal materials. Therefore, polysilicon gate electrodes may operate at much slower speeds than gates made of metallic materials. To partially compensate for this higher resistance, polysilicon materials often require extensive and expensive silicide processing in order to increase their speed of operation to acceptable levels.

A need exists in the industry for a metal gate device which can replace a polysilicon gate device. However, metal gates cannot withstand the higher temperatures and oxidation ambients which can be withstood by conventional polysilicon gate electrodes. In efforts to avoid some of the concerns with polysilicon gate electrodes, a replacement damascene metal gate process has been created. A damascene metal gate process forms a device with a disposable gate, with a source, drain, spacer, etc., as in conventional processing. The disposable gate and dielectrics are etched away, exposing an original gate oxide. The disposable polysilicon gate is then replaced by a metal gate to achieve the lower resistivity provided by the metal material.

One of the concerns in the replacement metal gate process is the gate oxide integrity. Conventional replacement metal gate processes lead to a gate oxide integrity that needs improvement. Another design consideration in semiconductor technology is that of the work function, which is the amount of energy required to excite electrons across the threshold. Polysilicon gates on silicon substrates provide a work function that allows the gates to be adequately controlled. The use of metal, however, as the gate material on a silicon substrate undesirably changes the work function in comparison to polysilicon gates. This reduces the controllability of the gate. A fully silicided gate, on the other hand, may also have issues such as gate oxide integrity, uniformity, thermal stability, and work function.

SUMMARY OF THE INVENTION

There is a need for a replacement metal gate arrangement and method for making the same that improves the gate oxide integrity, and overcomes issues such as uniformity, thermal stability, and work function mismatch.

These and other needs are met by embodiments of the present invention which provide a method of forming a metal replacement gate in a semiconductor device comprising the steps of forming a semiconductor device with a dummy gate, this semiconductor device including a gate dielectric, a silicon layer on the gate dielectric, and a dummy gate over the silicon layer. The dummy gate is removed and metal is deposited on the silicon layer. The metal is reacted with a silicon layer to form a metal-rich silicon layer on the gate dielectric.

By the formation of a metal-rich silicon layer on the gate dielectric, the work function issue is not a concern as the work function may be made compatible with the underlying silicon substrate. Further, gate oxide integrity is improved since the gate oxide is protected by the metal-rich silicon layer. Further, the thickness of the silicon layer is adjustable so that the region of avoids silicidation, as in a fully silicided gate structure.

The earlier stated needs are met by other aspects of the present invention which provide a semiconductor device having a replacement gate, comprising a gate dielectric on a substrate, a metal-rich silicon layer on the gate dielectric, and a replacement metal gate on the metal-rich silicon layer.

The foregoing and other features, aspects, and advantages of the present invention will become more apparent from the following detailed description of the present invention when taken in conjunction with the accompanying drawings.

DETAILED DESCRIPTION OF THE INVENTION

The present invention addresses and solves problems related to the use of replacement metal gates in semiconductor structures. In conventional semiconductor structures using replacement metal gates, the work function is often changed due to the use of metal on a silicon substrate. Additionally, replacement gate structures employing fully silicided gates suffer from work function concerns as well. The present invention provides a replacement metal gate with a work function that is at least substantially the same as the work function of a polysilicon gate on a silicon substrate, and also improves gate oxide integrity. This is achieved by providing an amorphous silicon layer on the gate dielectric, and forming a replacement metal gate electrode on the amorphous silicon layer. The replacement metal gate is reacted with the silicon layer to form a metal-rich silicon layer, not silicide, on the gate dielectric. The thickness of the silicon layer may be chosen to prevent silicide from forming since not enough silicon is present to create silicide when reacting with the metal of the replacement metal gate.

Figure 1:
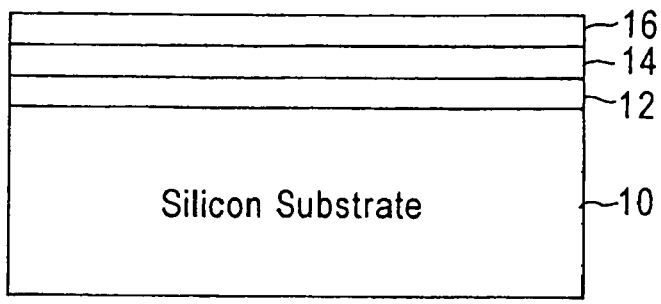
FIG. 1 depicts layers for forming a semiconductor device prior to etching.

FIG. 1 depicts a silicon substrate 10 on which a gate dielectric, such as a gate oxide, is formed as a layer 12. The gate oxide thickness may be a conventional thickness, such as between about 10 to about 20 Å, for example. The material for the gate dielectric layer 12 is not limited to gate oxide, but may be other gate dielectric materials as well, such as high k gate dielectrics, for example.

On top of the gate dielectric layer 12 is formed a silicon layer 14, which may comprise amorphous silicon or crystalline silicon. In the described exemplary embodiment, the silicon layer is assumed to be an amorphous silicon layer 14 and will hereafter be described as such. In exemplary embodiments of the invention, the thickness of the amorphous silicon layer 14 is between about 50 to about 300 Å. In other embodiments of the invention, the amorphous silicon layer is below 50 Å.

An etch stop layer 16 is formed on the silicon layer 14. In certain embodiments of the invention, the material forming the etch stop layer 16 is an oxide. Alternatively, other materials may be employed without departing from the present invention. Since the layer 16 serves merely as an etch stop, the layer 16 may be relatively thin, such as between about 5 to about 10 Å.

Figure 2:
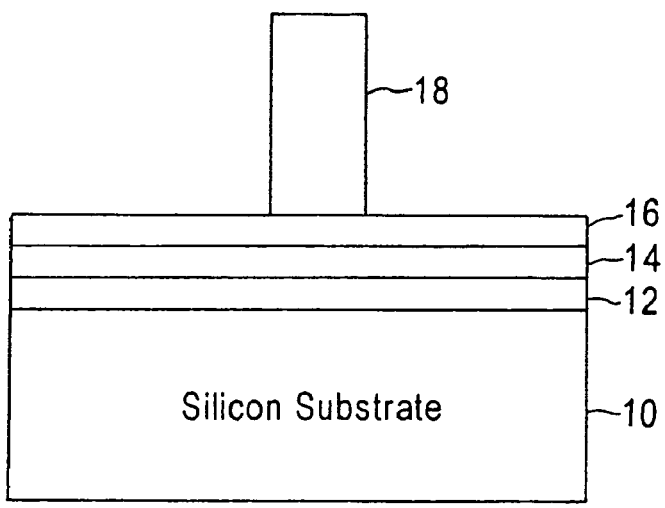
FIG. 2 depicts the layers of FIG. 1, with a polysilicon gate formed thereon, in accordance with embodiments of the present invention.

Turning now to FIG. 2, a polysilicon gate 18 is formed by conventional methodologies, including deposition of a polysilicon layer and dry etching, stopping on the etch stop layer 16. The polysilicon gate 18 is a dummy gate that will be replaced at a later stage.

Figure 3:
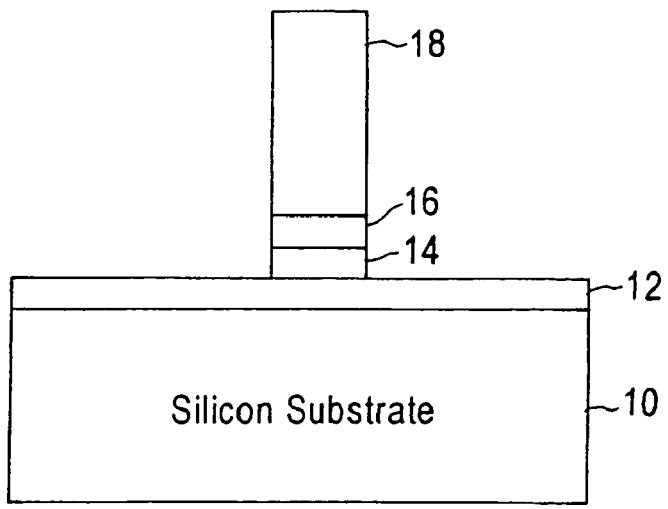
FIG. 3 shows the structure of FIG. 1, following removal of portions of the amorphous silicon layer and the etch stop layer, in accordance with embodiments of the present invention.

In FIG. 3, the etch stop layer 16 is etched by a relatively short dip, such as a hydrofluoric acid dip (HF dip). This is followed by removal of the silicon layer 14, except for the area underneath the dummy gate electrode 18. Conventional techniques for etching may be employed, as described above, to remove the etch stop layer 16 and the silicon layer 14 except for underneath the dummy gate electrode 18.

Figure 4:
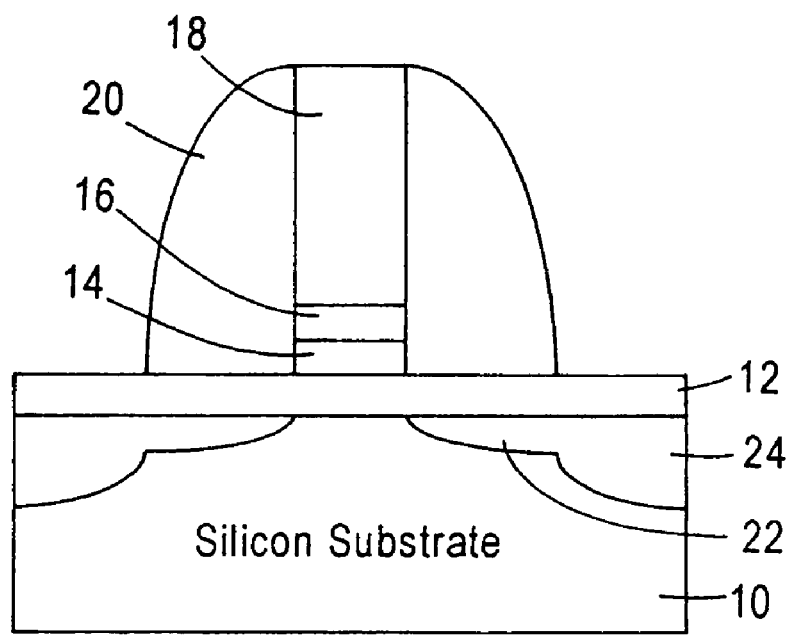
FIG. 4 depicts the structure of FIG. 3, following the formation of sidewall spacers on the gate electrode, in accordance with embodiments of the present invention.

FIG. 4 depicts the structure of FIG. 3 following the formation of sidewall spacers 20 in a conventional manner. This includes the deposition of a dielectric layer, such as an oxide or nitride, or other suitable material, followed by a dry etching. Such techniques are well known.

After the formation of the structure in FIG. 3, a source/drain extension implant is performed to create source and drain extensions 22 in the silicon substrate 10. A conventional source and drain extension implant process may be performed. After the sidewall spacers 20 are formed as in FIG. 4, a source and drain implant process is then performed to create source and drain regions 24, employing the sidewall spacers 20 as a mask, as is conventional.

Figure 5:
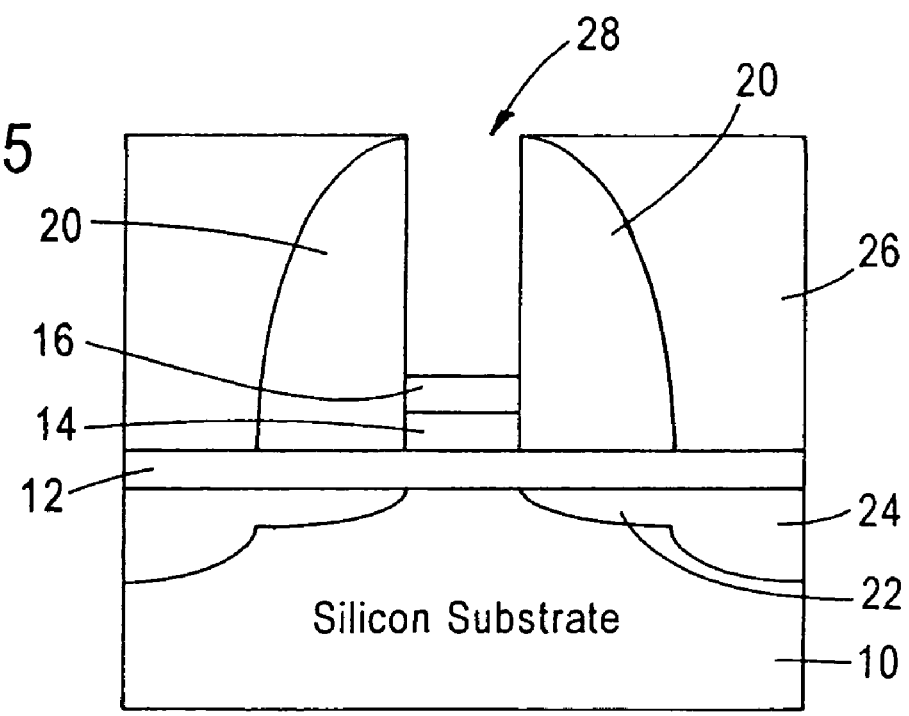
FIG. 5 depicts the structure of FIG. 4, following the deposition and planarization of a dielectric layer and the removal of the dummy gate, in accordance with embodiments of the present invention.

In FIG. 5, a dielectric layer 26 has been formed on the gate dielectric layer 12 and on the sidewall spacers 20. Following the deposition of the dielectric layer 26, a polishing, such as a chemical mechanical polishing, for example, is performed to planarize the dielectric layer 26. This also exposes the top of the dummy gate electrode 18.

A removal process is performed to etch the dummy gate electrode 18 and remove it entirely. This creates a recess 28 between the sidewall spacers 20. The etching is stopped by the etch stop layer 16, thereby preserving the silicon layer 14 underneath the etch stop layer 16. A conventional technique is employed for removing the dummy gate electrode 18. For example, a dry etch that is selective to oxide may be employed that will stop on the oxide of the etch stop layer 16.

Figure 6:
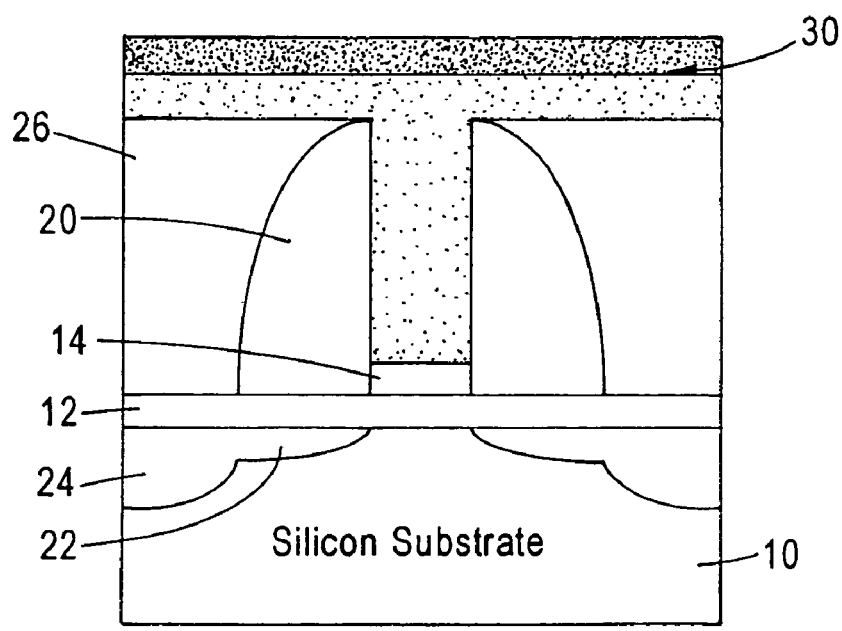
FIG. 6 shows the structure of FIG. 5, following the removal of the etch stop layer and the subsequent deposition of a metal layer, in accordance with embodiments of the present invention.

Following the formation of the structure in FIG. 5, the etch stop layer 16 is removed by a conventional wet etch technique that removes oxide or other material forming the etch stop layer 16. This leaves the silicon layer 14 intact. A metal deposition process is then performed, which results in metal 30 being deposited, as shown in FIG. 6, within the recess 28 and on top of the dielectric layer 26. The metal 30 contacts the silicon layer 14. In order to provide a suitable work function, the metal material should be matched to the type of device the transistor will form. For example, if the semiconductor device is an NMOSFET, suitable refractory metals include tantalum or tantalum nitride. If a semiconductor device is to be a PMOSFET, ruthenium or rhenium are suitable metals. When reacted with silicon to form a metal-rich silicon, as will be described with respect to FIG. 7, these metals produce a work function in the metal-rich silicon that is suitable for NMOSFETS and PMOSFETS, respectively.

Figure 7:
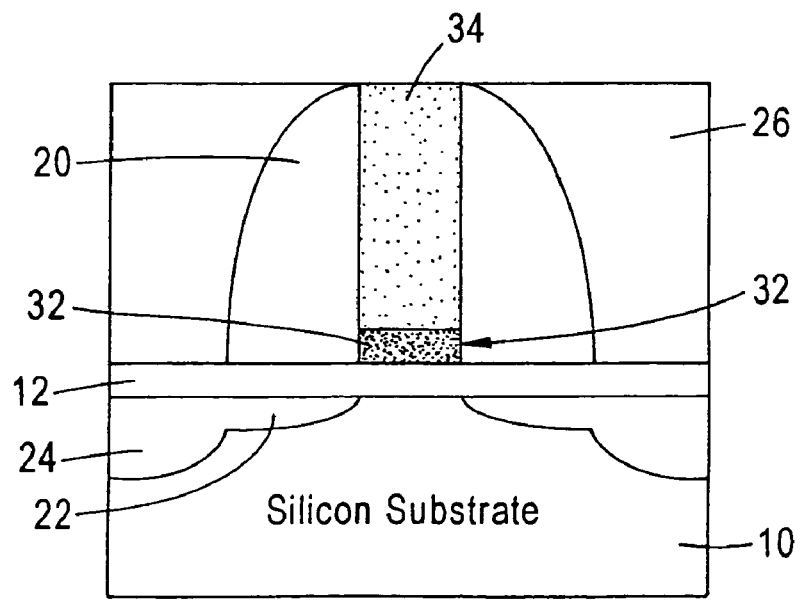
FIG. 7 shows the structure of FIG. 6, following a metal planarization and heating to react the metal with the amorphous silicon to create a metal-rich silicon region, in accordance with embodiments of the present invention.

Referring now to FIG. 7, a metal chemical mechanical-polishing (CMP) process is performed to remove the metal 30 from the dielectric layer 26. A heating process is then performed, the temperatures of which depend upon the type of metal 30 that is present. With tantalum or tantalum nitride, for example, temperatures between about 600 to about 700° C. may be employed. The heating of the arrangement causes the metal 30 to react with the silicon 14 to create metal-rich silicon 32. The metal 30 forms the metal gate 34.

The thickness of the silicon layer 14 was specifically selected so as to prevent the formation of silicide, which would change the work function undesirably. However, the formation of the metal-rich silicon region 32 makes the metal-rich silicon region conductive. Further, this eliminates a polysilicon depletion effect that is undesirable in semiconductor devices.

The present invention thus provides a semiconductor device with a metal gate that has been formed by a replacement metal gate process that exhibits an improved gate oxide integrity, and avoids issues that arise with fully silicided gates, such as gate oxide integrity, uniformity, thermal stability, and work function.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a metal replacement gate in a semiconductor device, comprising the steps:

forming a semiconductor device with a dummy gate, the semiconductor device including a gate dielectric, a silicon layer on the gate dielectric, and the dummy gate over the silicon layer;

removing the dummy gate;
depositing metal on the silicon layer; and
reacting the metal with the silicon layer to form a metal-rich silicon layer on the gate dielectric and a metal gate on the metal-rich silicon layer.

2. The method of claim 1, further comprising an etch step layer on the silicon layer, the step of removing the dummy gate including etching the dummy gate and stopping on the etch stop layer.

3. The method of claim 2, further comprising removing the etch stop layer prior to depositing the metal on the silicon layer.

4. The method of claim 3, wherein the gate dielectric is an oxide.

5. The method of claim 4, wherein the etch stop layer is an oxide.

6. The method of claim 5, wherein the silicon layer is between about 50 to about 300 Å.

7. The method of claim 6, wherein the etch stop layer is between about 5 to about 10 Å.

8. The method of claim 7, wherein the metal is at least one of tantalum (Ta), tantalum nitride (TaN), ruthenium (Ru), and rhenium (Re).

9. The method of claim 8, wherein the step of reacting the metal with the silicon layer includes heating the semiconductor device.

10. The method of claim 9, wherein the step of forming a semiconductor device includes etching a polysilicon layer to form the dummy gate, the etching of the polysilicon layer stopping on the etch stop layer.

11. The method of claim 10, wherein the step of forming a semiconductor device further includes etching the etch stop layer and the silicon layer, stopping on the gate dielectric.

12. The method of claim 11, wherein the step of forming a semiconductor device further includes forming insulating sidewall spacers on the dummy gate, the etch stop layer and the gate dielectric.

13. The method of claim 12, further comprising forming a dielectric layer on the gate dielectric layer and on the sidewall spacers, and polishing the dielectric layer.

14. The method of claim 1, wherein the silicon layer has a thickness less than a thickness required to form a silicide during the reacting of the metal with the silicon layer.

15. A semiconductor device having a replacement gate, comprising:
a gate dielectric on a substrate;
a metal-rich silicon layer on the gate dielectric; and
a replacement metal gate on the metal-rich silicon.

16. The device of claim 15, wherein the metal-rich silicon layer has a thickness between about 50 Å to about 300 Å.

17. The device of claim 15, wherein the metal-rich silicon layer has a thickness less than a thickness required to form a silicide when reached with a refractory metal.

18. The device of claim 17, wherein the metal is at least one of Ta or TaN.

19. The device of claim 17, wherein the metal is at least one of Ru or Re.

* * * * *